(12) United States Patent
Carr et al.

(10) Patent No.: US 6,449,214 B1
(45) Date of Patent: Sep. 10, 2002

(54) STATISTICS COUNTER OVERFLOW CONTENT ADDRESSABLE MEMORY (CAM) AND METHOD

(75) Inventors: David W. Carr, Nepean; Edward D. Funnekotter, Ottawa, both of (CA)

(73) Assignee: Silicon Access Networks, San Jose, CA (US)

( * ) Notice: Subject to any disclaimer, the term of this patent is extended or adjusted under 35 U.S.C. 154(b) by 28 days.

(21) Appl. No.: 09/727,533

(22) Filed: Nov. 28, 2000

(51) Int. Cl.[7] .................................................. G11C 8/00
(52) U.S. Cl. .......................................... 365/236; 365/49
(58) Field of Search ................... 365/236, 49; 709/224, 709/240

(56) References Cited

U.S. PATENT DOCUMENTS

| | | | | |
|---|---|---|---|---|
| 5,179,549 A | * | 1/1993 | Joos et al. ..................... 370/17 |
| 6,304,903 B1 | * | 10/2001 | Ward ........................... 709/224 |
| 2002/0010793 A1 | * | 1/2002 | Noll et al. .................. 709/240 |

* cited by examiner

*Primary Examiner*—Vu A. Le
(74) *Attorney, Agent, or Firm*—Fernandez & Associates, LLP

(57) ABSTRACT

A method and means to reduce memory requirements for storing statistics by recording, in a separate overflow memory, the most significant bits of counters requiring more bits than provided in the main statistics memory. A binary CAM provides the linking mechanism between the main and overflow memories.

9 Claims, 6 Drawing Sheets

STATISTICS COUNTER OVERFLOW CONTENT ADDRESSABLE MEMORY (CAM) AND METHOD

BACKGROUND INFORMATION

1. Field of the Invention

The present invention relates to the field of integrated circuits, and particularly to statistics memories.

2. Description of Related Art

Electronic devices in many instances are used to maintain an accurate count of an event. Whether an electronic device counts the number of packets that transit a router in the Internet or an electronic device that monitors the number of cars of a certain make that drive past an observation point on the side of a highway, similar principles of counting apply. When an event occurs, the counter increments by one. In some instances for example, the counter records the weight of the vehicles, the counter is typically increase by a number larger than one.

In order for this counter to be stored within the electronic device, the counter is placed within some electronic storage medium. Since this medium cannot be infinite in size, a size is wisely chosen that will suit the needs of the event being counted. Three factors need consideration when determining the size of the storage for a single counter: first, the highest rate possible that the event could occur; second, the amount by which the counter could be incremented; third, the rate at which the counter is copied to a location elsewhere and can then be reset to zero.

A common shortcoming that results when determining the appropriate size of a counter is that one needs to consider the worst possible case and then size the counter to hold that worst case. For example, in a device that counted the makes of cars, if it is determined that the maximum rate of cars that can pass the device is 1000 cars per hour and that the counts will be recorded once a day, then the maximum value that a counter will have to hold is 24000–1000 cars per hour * 24 hours. But since it is desirable to have an individual counter per make of car, what size should a counter be selected? In the worst case, every car could be the same make, perhaps due to a large Mercedes convention taking place. To ensure that no make counters overflow, each counter needs to hold 24000. In such instance, the number of individual makes of cars is increased, and the wastage of counters becomes greater and greater. If during one day, only Hondas and Toyotas that used the road, each may have a count of 12000 while all the other counters remained at zero. Since every counter was sized to accept 24000, this is obviously quite wasteful.

A more realistic example of this is for packets being counted each time the packets are forwarded by an Internet router. Packet classification steps within the router group many packets into logical grouping commonly referred to as flows. Numbers of packets received and the number of bytes within the received packets are then counted against these flows. In the same way that the counters in the example above had to be sufficiently large to handle the case where all cars were the same make, the counters in the Internet router needs to be large enough to handle the case where a significant portion of the packets belong to the same logical grouping. As is the case in the car example above, the resulting counter design is quite wasteful in order to cover the worst-case counter size scenario.

FIG. 1 shows a conventional architectural diagram of a statistics memory 10 coupled to a statistics logic or microprocessor 11. In this illustration, the statistics memory 10 has a length of 512K (524,288) entries, with each counter having a worst case of 42 bits in width, totaling 21 Mbits in the size of the statistics memory 10. Such crude approach in designing a statistics memory fails to optimally utilize the memory capacity, requires a larger die size, and increases the manufacturing costs.

Accordingly, it is desirable to have a statistics memory design that significantly reduces the wastefulness of in storing counter contents.

SUMMARY OF THE INVENTION

The present invention overcomes the foregoing limitations by using small counters for the events that occur infrequently, and larger counters for the events that happened often. In one embodiment, a binary CAM is provided to reduce the storage space required for statistics counters by learning which events requires larger counters as events are recorded. A CAM is a memory that stores data in association with a specified key. When data is stored in a CAM, data and an associated key are given to the CAM. When the data is desired, the CAM is presented with the key and the CAM will use the key to find its associated data. If the key has not been stored in the CAM before the request, no match is found and no data is returned.

Advantageously, in commercial applications that require accurate storage of a large number of mutually exclusive counters, the present invention significantly reduces the memory storage requirements of counters, resulting in allocating much less space to each of the counters. If some of the counters exceed their storage space, the excess counter information is stored in a CAM entry that is associated with the counter's address. The present invention also minimizes or eliminates off-chip delays by the usage of internal or embedded memories on an integrated circuit.

DETAILED DESCRIPTION OF PREFERRED EMBODIMENT

Figure 1:
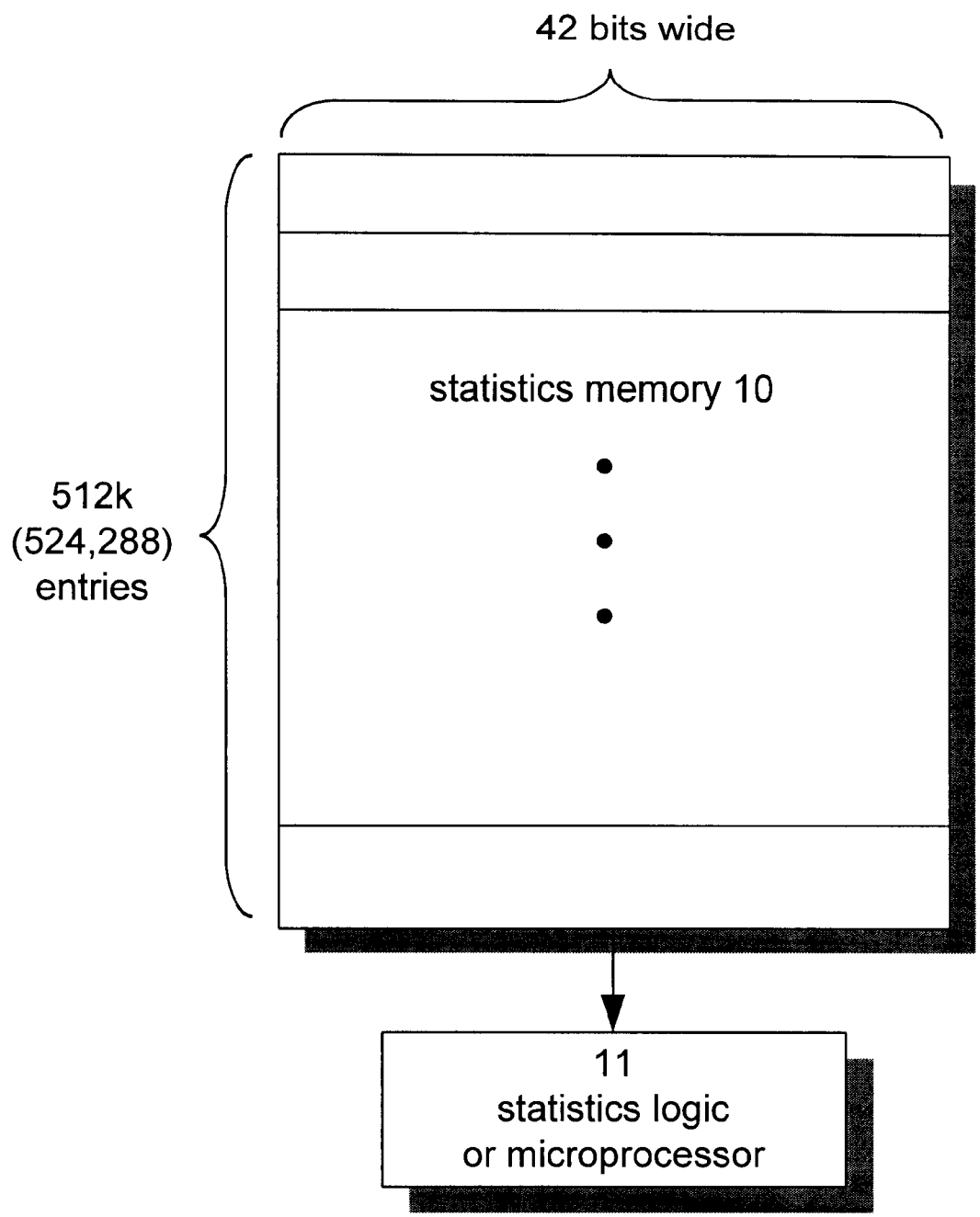
FIG. 1 is a conventional architectural diagram of a statistics memory.
Figure 2A:
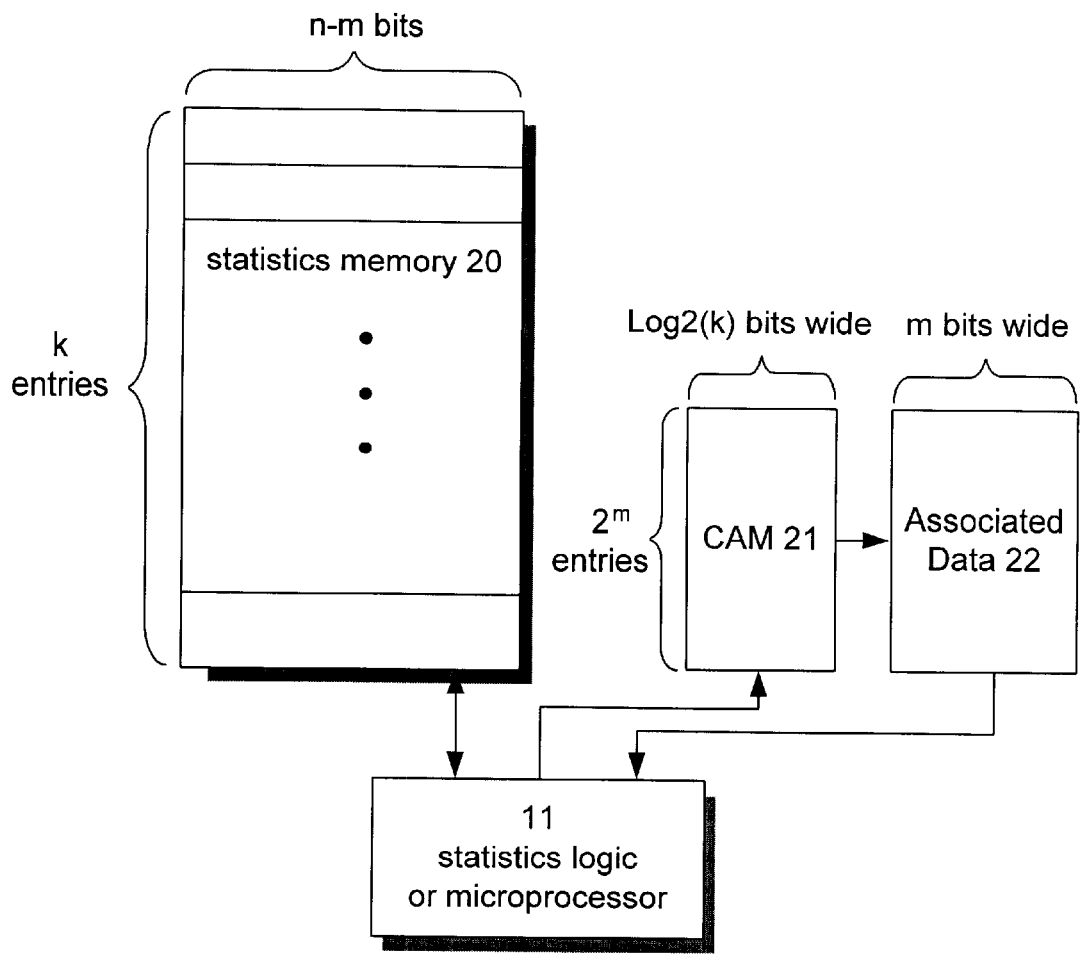
FIG. 2A is a general architectural diagram illustrating a statistics memory with an overflow CAM in accordance with the present invention.

FIG. 2A is a statistics memory 20 with an overflow CAM 21 and an associated data 22. The overall size of the statistics memory is significantly reduced by m bits, resulting in k entries in memory length and n-m in memory width. The n-m width represents the least significant bits (LSB) in a counter content or counter entry. Each counter entry in k entries corresponds to an entry in $2^m$ entries in the CAM 21. Each entry in the CAM 21 corresponds to associated data 22 for storing m bits, the most significant bits (MSB) in a counter entry.

Figure 2B:
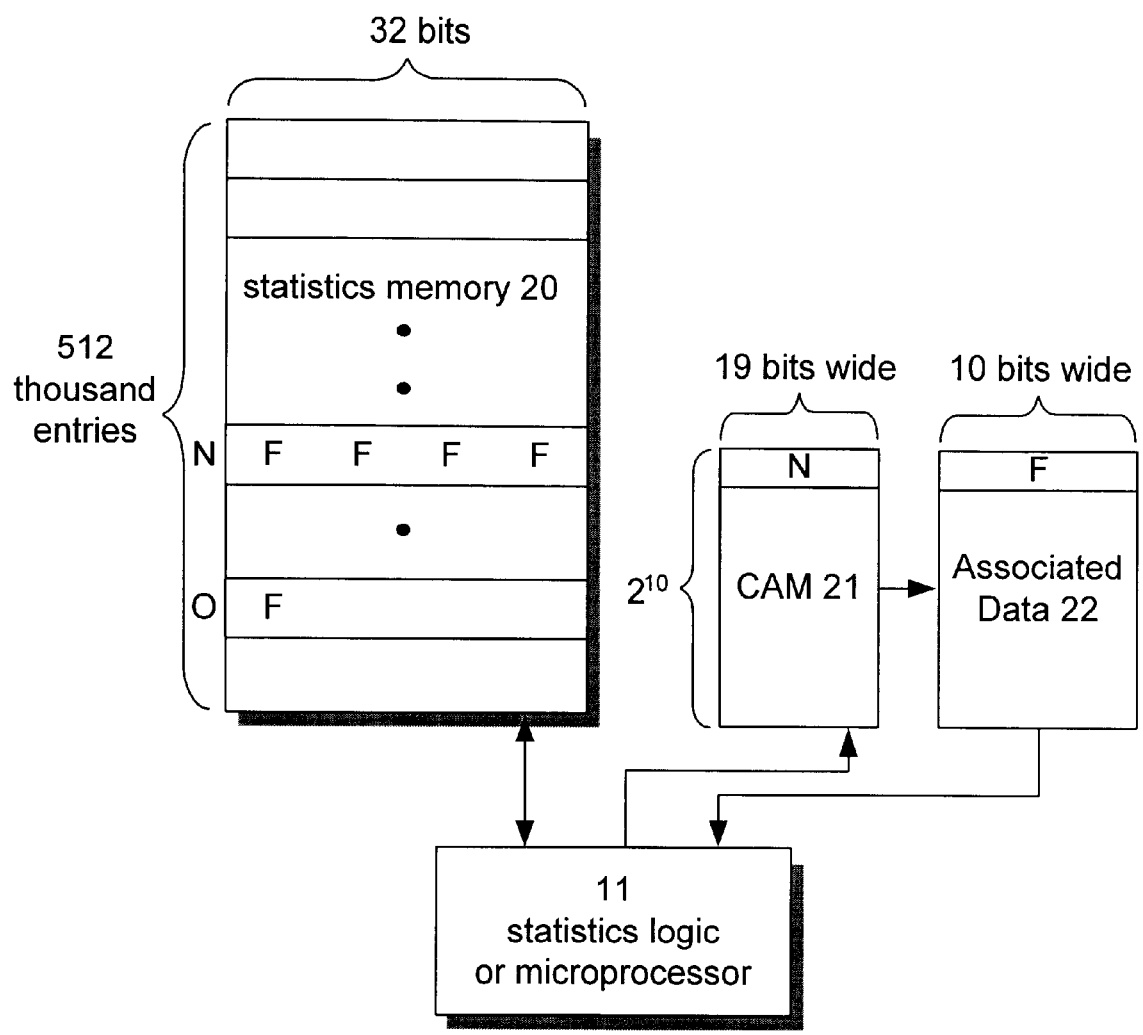
FIG. 2B is one example of the general architectural diagram of a statistics memory as depicted in FIG. 2A.

FIG. 2B is one example of the general architectural diagram of a statistics memory as described in FIG. 2A. The total number of bits in a counter entry is 42 bits, with the lower 32 bits stored as LSB in the statistics memory 20 and the upper 10 bits stored as MSB in the associated data 22. When the counter address N in the statistics memory 20 in which the lower 32 bits have been filled up with FFFF, then the counter overflows to a first position in the CAM 21 and records the counter address "N". The upper bits or MSB of counter values at the counter address N is then stored in the corresponding location of the associated data 22, relative to the counter address N in the CAM 21.

Data structure in a statistics memory is augmented with the CAM 21. Address N overflows to the CAM 21. Associated with address N of the CAM 21 is another 10 bits of memory in the associated data 22. In combination with the 32 bits in the statistics memory 21, and the 10 bits in the associated data 22, it is now a 42-bit counter.

In one embodiment, the statistics memory 20 is implemented in a dynamic random access memory (DRAM), and the associated data 22 is implemented in a static random access memory (SRAM). However, one of ordinary skilled in the art should recognize that various combinations or a different type of memory may be used without departing from the spirits in the present invention.

Figure 3:
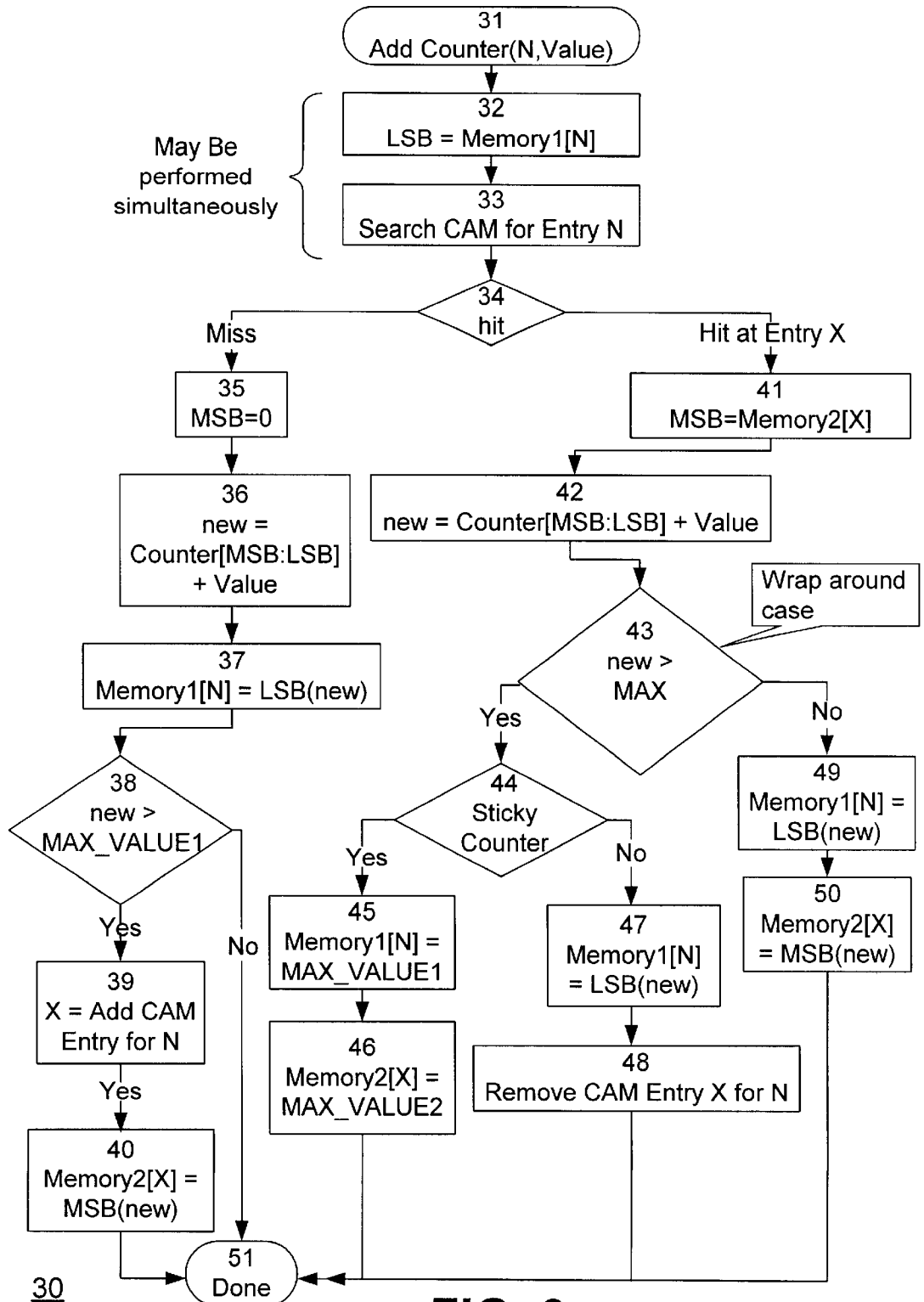
FIG. 3 is a flow diagram illustrating the process of an add counter in a statistics memory with an overflow CAM in accordance with the present invention.

FIG. 3 a flow diagram illustrating a statistics process 30 of an add counter in a statistics memory with an overflow CAM. In describing the statistics process 30, memory 1 refers to the statistics memory 20, and memory 2 refers to the associated data 22. An add counter operation starts in a step 31. The statistics process 30 reads 32 the LSB in the memory 1 at counter address N, and searches 33 the CAM 21 for an entry N. Steps 32 and 33 may be executed simultaneously or sequentially.

Two possible scenarios emerge in determining whether there is a hit 34 in searching for an entry N in the CAM 21. In the first case, the result is a miss, representing that there is no entry N in the CAM 21. This indicates that counter N has not previously overflowed. The MSB of entry N is therefore zero. Step 36 increments the new larger composite counter value, composed by concatenating the MSB (zero) and the LSB from 32 by the increment value passed. The Least Significant Bits (LSB) of the new value is then stored back to the memory 1 at counter N location. At a step 38, if the new value is greater than MAX1 ($2^{width(Memory1)}-1$) which is the maximum value that can be stored in the memory 1, then the statistics process 30 allocates 39 a free CAM entry: X=add CAM entry for N and put N into the CAM 21. The CAM 21 returns X, the index of N. At memory2[X], the statistics process 30 puts 40 the MSB of the composite counter. If the new value did not exceed MAX1 in the step 38, then the statistics process 30 does not need to access memory 2 since there can be no entry for N.

In the second scenario, the result is a hit, representing that there is a hit for the value N at entry X in the CAM 21. The MSB for counter N is retrieved 41 from memory2 at location X. Step 42 increments the composite counter, created by appending the LSB and MSB, by the value passed. Step 43 tests for a wrap-around condition—where a value added to the composite counter causes the result to exceed the maximum possible composite counter value MAX which can be stored using bits stored in both statistics memory 20 combined with the associated data memory 22. MAX is equal to $2^{Width(Memory1)+Width(Memory2)}-1$. If a wrap-around condition is present, then the statistics process 30 checks 44 the configuration for that counter to see if the configuration is sticky. A sticky counter configuration denotes that the counter should never increment past the maximum value. If the configuration is sticky, then MAX1 is stored 45 in the memory 1, and MAX2 ($2^{Width(Memory2)}-1$) is stored 46 in the memory 2. In essence, the memory 1 and the memory 2 are stored with max values, or with binary values of all "1". If the configuration is not sticky (this is the wrap-around case), then the statistics process 30 stores 47 back the LSB of the composite counter into memory 1. The CAM entry X for N is removed because the MSB are not needed anymore since the MSB are wrapped around to zeros; the CAM entry is freed up. If the new value did not exceed MAX, the statistics process 30 stores the LSB of the composite counter back in the memory 1 in a step 49 and stores the MSB of the composite counter back in the memory 2 in a step 50. The add counter operation is concluded in a step 51.

Figure 4:
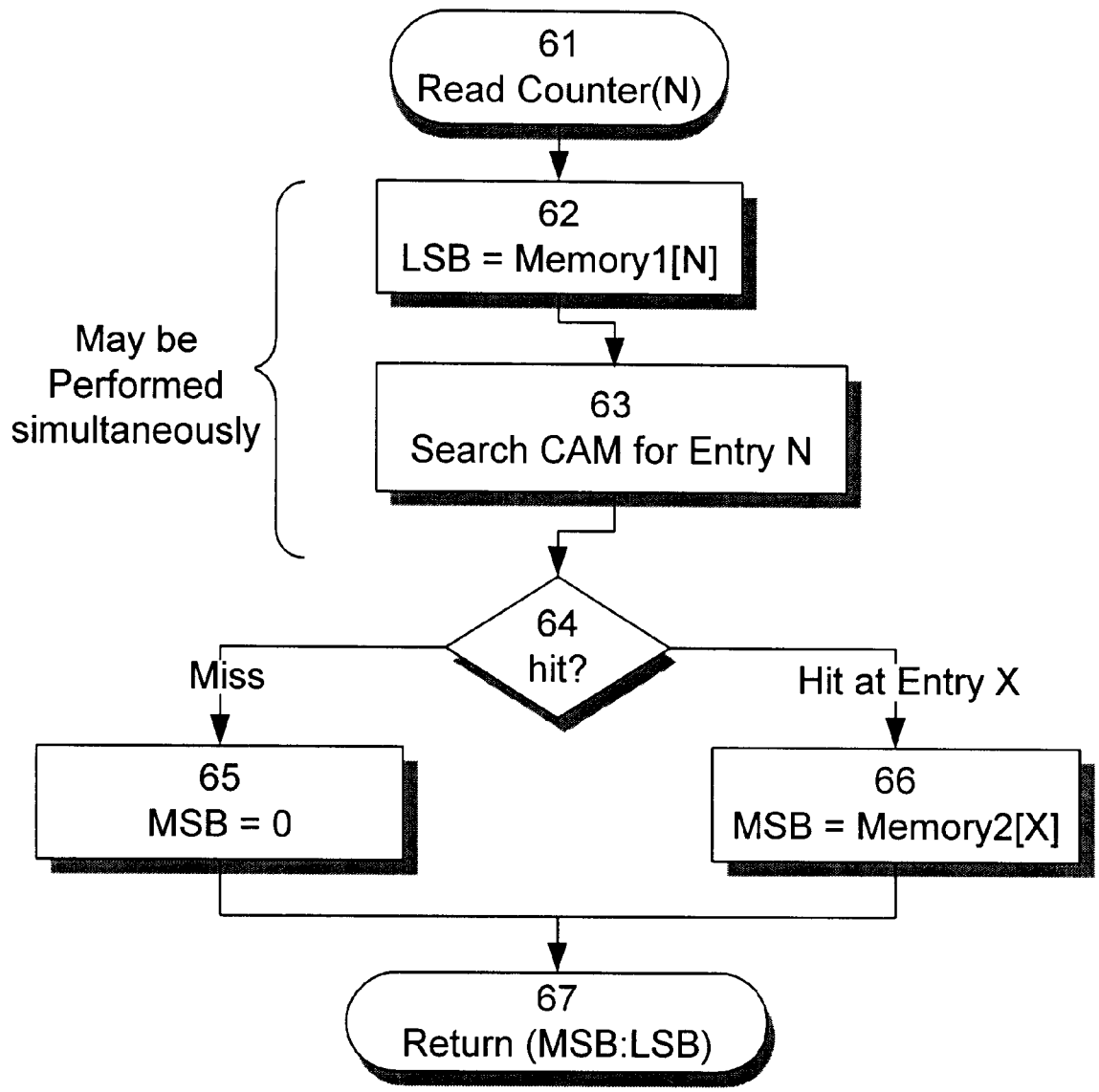
FIG. 4 is a flow diagram illustrating the process of a read counter in a statistics memory with an overflow CAM in accordance with the present invention.

FIG. 4 is a flow diagram illustrating a process 60 of a read counter in a statistics memory with an overflow CAM. A read counter(N) operation starts at a step 61. The process 60 reads 62 the LSB in memory 1 at counter address N, and searches 63 the CAM 21 for an entry N to determines whether there is a hit in a step 64. Steps 62 and 63 may be executed simultaneously or sequentially. On the one hand, if the CAM search result is a miss, then the MSB is set to zero. On the other hand, if the result is a hit, then the MSB is set to equal to the data retrieved from the memory 2. At a step 67, the composite counter value including MSB:LSB is then returned.

Figure 5:
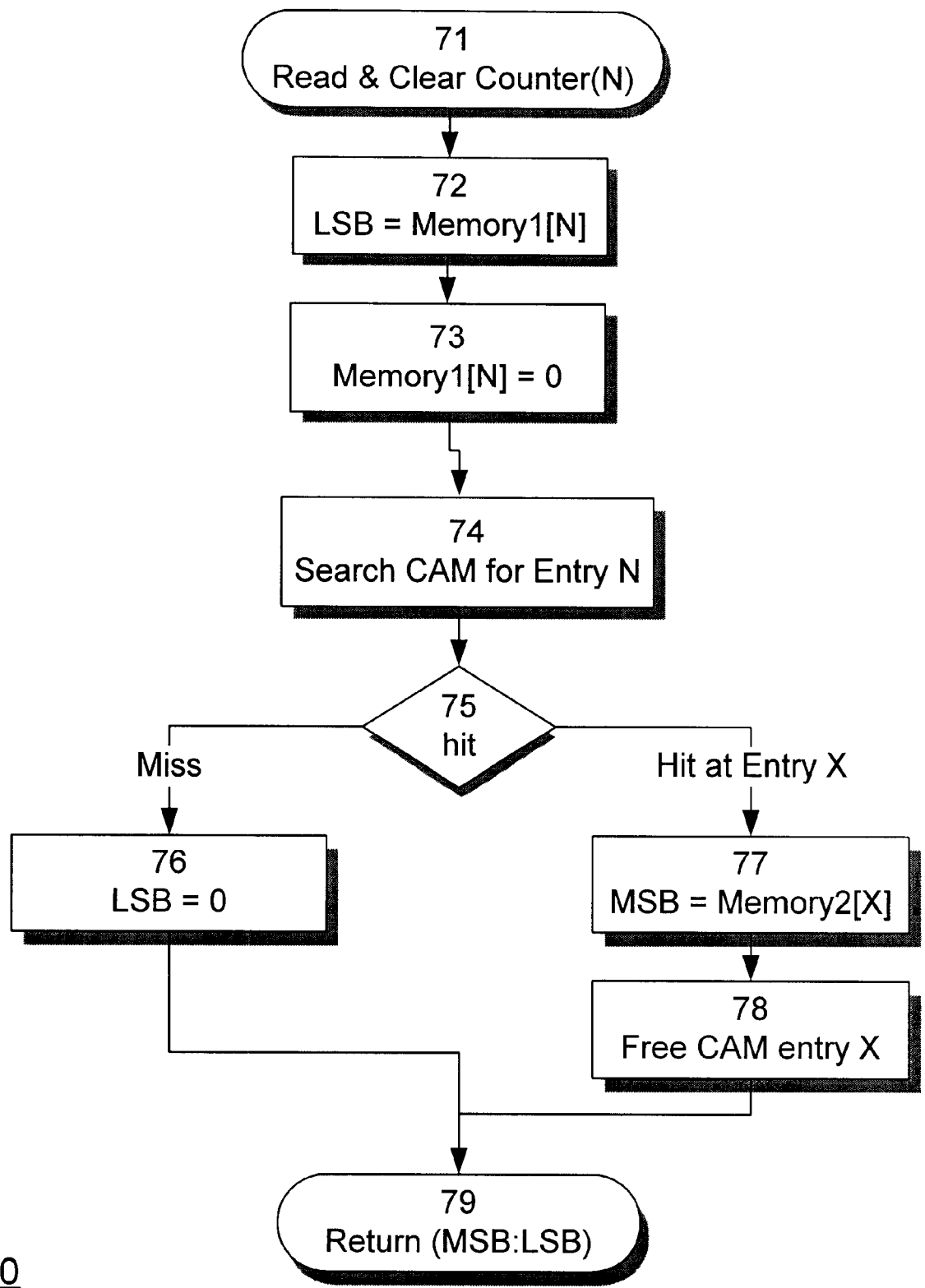
FIG. 5 is a flow diagram illustrating the process of a read and clear counter in a statistics memory with an overflow CAM in accordance with the present invention.

FIG. 5 is a flow diagram illustrating a process 70 of a read-and-clear counter operation in a statistics memory with an overflow CAM. A read-and-clear counter(N) operation starts at a step 71. The process 70 reads 62 the LSB in the memory 1 at counter address N, and clears 73 the memory 1 location by setting it to zero. At a step 74, the process 70 searches 73 the CAM 21 for an entry N. Steps 72 and 74 may be executed simultaneously or sequentially. Step 75 determines whether there is a hit in the CAM. If a miss occurs. MSB is set to zero. If a hit results at entry X, the MSB is set to equal to the value of the memory 2 in a step 77. Step 78 frees CAM 21 entry X as it is no longer required. At a step 79, the composite counter value of MSB:LSB is returned.

Therefore, the present invention uses shorter counters to cover normal cases, and has longer counters to cover the extreme cases, thereby saves memory space on a chip. Normally, shorter counters suffice for the majority of events. When a counter is about to roll over, the statistic memory 20 dynamically allocates a larger counter in the CAM 21 and the associated data 22 creating a longer counter.

One of ordinary skilled in the art should recognize that there is a tradeoff in selecting the size of the memories (DRAM or SRAM for Memory1), a CAM, and the associated data memory2. If the width of memory1 selected is too small, then the design will require a larger CAM. If the width of Memory1 selected is too wide, then the design fails to obtain the benefits of counter overflows in the CAM. The selection of an optimal Memory1 width and CAM size will depend on the type of memory technology (SRAM versus DRAM), or if a fabrication process moves to a different geometry.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A memory structure, comprising, a first memory for storing the least significant bits of a counter content at a first counter index;

a content addressable memory (CAM) for recording the counter index when the counter content exceeds the width of the first memory; and a second memory, coupled to the CAM, each memory line in the second memory corresponds with an entry in the CAM, the second memory storing the most significant bits of the counter content.

2. The memory structure of claim 1 wherein the CAM comprises a binary CAM.

3. The memory structure of claim 1 wherein the CAM comprises a ternary CAM.

4. A method for processing statistics counter overflows, comprising the steps of:

storing the least significant bits of a counter content at a first counter index in a first memory;

if the counter content exceeds the width of the first memory, recording the counter index in a content addressable memory (CAM); and storing the most significant bits of the counter content in a second memory, wherein each memory line in the second memory corresponds with an entry in the CAM.

5. The method of claim 4, further comprising the step of adding a counter value to the counter content.

6. The method of claim 4, further comprising the step of reading the counter content.

7. The method of claim 4, further comprising the step of reading and clearing the counter content.

8. A statistics memory, comprising first memory means for storing a first portion of a counter content at a first counter index; and second memory means for storing a second portion of a counter content of the counter content, the second memory means coupled to the first memory means.

9. The statistics memory of claim 8, further comprising a recording means, coupled between the first second memory means and the second memory means, for recording a counter index when the counter content exceeds the width of the first memory means.

* * * * *